United States Patent
Wikus et al.

(10) Patent No.: US 10,101,420 B2
(45) Date of Patent: Oct. 16, 2018

(54) CRYOSTAT ARRANGEMENT WITH A VACUUM CONTAINER AND AN OBJECT TO BE COOLED, WITH EVACUABLE CAVITY

(71) Applicant: Bruker BioSpin GmbH, Rheinstetten (DE)

(72) Inventors: Patrick Wikus, Nuerensdorf (CH); Steffen Bonn, Zurich (CH)

(73) Assignee: BRUKER BIOSPIN GMBH, Rheinstetten (DE)

( * ) Notice: Subject to any disclaimer, the term of this patent is extended or adjusted under 35 U.S.C. 154(b) by 0 days.

(21) Appl. No.: 15/710,283

(22) Filed: Sep. 20, 2017

(65) Prior Publication Data

US 2018/0081011 A1    Mar. 22, 2018

(30) Foreign Application Priority Data

Sep. 20, 2016 (DE) .......................... 10 2016 218 000

(51) Int. Cl.
*G01R 33/38* (2006.01)
*G01R 33/3815* (2006.01)
(Continued)

(52) U.S. Cl.
CPC ........ *G01R 33/3804* (2013.01); *F25B 49/005* (2013.01); *G01R 33/3815* (2013.01);
(Continued)

(58) Field of Classification Search
CPC .... F25D 19/00; F25B 9/10; F25B 9/14; H01F 6/04; G01R 33/3804; G01R 33/3815
See application file for complete search history.

(56) References Cited

U.S. PATENT DOCUMENTS

| 4,765,153 A | 8/1988 | Wachi |
| 8,950,194 B2 | 2/2015 | Hughes et al. |

(Continued)

FOREIGN PATENT DOCUMENTS

| DE | 102004012416 B4 | 9/2005 |
| DE | 102005029151 A1 | 12/2006 |

(Continued)

OTHER PUBLICATIONS

Office Action in corresponding German Application 102016218000.2, dated May 29, 2017, along with English Translation.

(Continued)

*Primary Examiner* — Brian King
(74) *Attorney, Agent, or Firm* — Edell, Shapiro & Finnan, LLC

(57) ABSTRACT

A cryostat arrangement (1), with a vacuum container (2) and an object (4) to be cooled, is provided, wherein the object (4) to be cooled is arranged inside the vacuum container (2) comprising a neck tube (8) leading to the object (4) to be cooled. A closed cavity (9) is formed around the cooling arm (10) of a cold head (11), wherein the cavity (9) in normal operation is filled at least partly with a first cryogenic fluid (34), and wherein a first thermal coupling component (15) is provided for the thermal coupling of the first cryogenic fluid (34) in the cavity (9) to the object (4) to be cooled. The cryostat arrangement (1) further comprises a pump device (14), to which the cavity (9) is connected, and with which the cavity (9) is configured to be evacuated upon failure of the cooling function of the cold head (11). Various cryostat configurations are provided.

15 Claims, 10 Drawing Sheets

(51) Int. Cl.
*F25B 49/00* (2006.01)
*F17C 3/08* (2006.01)
*F17C 13/00* (2006.01)
*F25D 19/00* (2006.01)
*H01F 6/04* (2006.01)

(52) U.S. Cl.
CPC ............ *F17C 3/085* (2013.01); *F17C 13/007* (2013.01); *F17C 2203/0629* (2013.01); *F17C 2223/0161* (2013.01); *F17C 2270/02* (2013.01); *F17C 2270/0536* (2013.01); *F25B 2500/06* (2013.01); *F25D 19/006* (2013.01); *H01F 6/04* (2013.01)

(56) References Cited

U.S. PATENT DOCUMENTS

| | | |
|---|---|---|
| 2006/0064989 A1 | 3/2006 | Roth |
| 2007/0022761 A1 | 2/2007 | Schlenga et al. |
| 2007/0051115 A1 | 3/2007 | Kraus et al. |
| 2007/0089432 A1* | 4/2007 | Boesel .................. F25D 19/006 62/51.1 |
| 2009/0193816 A1* | 8/2009 | Clayton .................. F25D 19/00 62/47.1 |
| 2010/0298148 A1 | 11/2010 | Schlenga et al. |
| 2016/0084440 A1* | 3/2016 | Strobel .................. F17C 3/085 62/51.1 |

FOREIGN PATENT DOCUMENTS

| | | |
|---|---|---|
| DE | 102014218773 A1 | 3/2016 |
| EP | 1557624 A2 | 7/2005 |
| GB | 2414538 A | 11/2005 |
| GB | 2457054 A | 8/2009 |
| GB | 2525216 A | 10/2015 |
| JP | S62185383 A | 8/1987 |
| JP | S63207958 A | 8/1988 |
| JP | S6423062 A | 1/1989 |
| JP | H05243042 A | 9/1993 |
| JP | 2005055003 A | 3/2005 |

OTHER PUBLICATIONS

Catarino et al., "Neon gas-gap heat switch" Cryogenetics, vol. 48, No. 1-2, Jan. 2008, pp. 17-25.

* cited by examiner

CRYOSTAT ARRANGEMENT WITH A VACUUM CONTAINER AND AN OBJECT TO BE COOLED, WITH EVACUABLE CAVITY

CROSS REFERENCE TO RELATED APPLICATIONS

The following disclosure is based on and claims the benefit of and priority under 35 U.S.C. § 119(a) to German Patent Application No. 10 2016 218 000.2, filed Sep. 20, 2016, and the disclosure of which is incorporated in its entirety into the present Continuation by reference.

FIELD OF THE INVENTION

The invention relates to a cryostat comprising a vacuum container, wherein an object to be cooled is arranged within the vacuum container.

BACKGROUND

Nuclear spin resonance (NMR) apparatus, such as NMR spectrometers and NMR tomography machines, require strong magnetic fields which are typically generated by superconducting magnet coils. The superconducting magnet coils must be operated at a cryogenic temperature. For this, the magnet coils are typically arranged in a cryostat. The cryostat comprises an evacuated container ("vacuum container"), in which an object to be cooled is arranged, often further surrounded by a radiation shield. The object to be cooled may be the magnet coil itself ("cryofree" system), or also a cryocontainer, in which a cryogenic liquid (such as liquid helium) and the magnet coil are arranged.

The object to be cooled is generally cooled by an active cooling system, usually comprising a pulse tube refrigerator or a Gifford-MacMahon cooler. Active cooling systems reduce the consumption of costly liquid helium, increase the availability of the NMR apparatus, and may also contribute to reducing the structural height. The active cooling system may be a single-stage or a multiple-stage configuration. In multiple-stage systems, usually a warmer cold stage cools the thermal radiation shield and a colder cold stage chills the object to be cooled.

Upon malfunctioning of the active cooling system, the superconducting magnet coil or the superconducting magnet coils ("superconducting magnet coil system") should be able to remain below the critical temperature until a repair of the active cooling system can be undertaken. A loss of the superconducting state due to a warm-up may result in the destruction of the superconducting magnet coil system; but also, a renewed cooling of the superconducting magnet coil system would at least entail substantial expense.

In the most common designs of cryostats with active cooling, cf. US 2007/089432 A, the cooling arm of a cooling head protrudes into a neck tube of a vacuum container. The neck tube is open towards a cryocontainer, in which a superconducting magnet coil is arranged in liquid helium. At the lowermost cooling stage of the cooling arm, helium recondenses and drips back into the cryocontainer. Similar cryostats are known from US 2010/298148 A, US 2007/022761A, German Patent No. DE 10 2004 012 416 B4 or US 2007/051115 A.

In order to afford the longest possible time between a malfunctioning of an active cooling system and a service intervention, the thermal masses (i.e., the mass multiplied by the specific heat capacity) in the cryostat, such as a radiation shield or a cryocontainer including cryogenic liquid, may be chosen to be large, but this increases the structural height and the overall weight of the cryostat. Likewise, in cryostats with a cryocontainer, it is possible to replenish externally procured liquid helium in order to replace evaporated helium; yet this is very costly.

According to U.S. Pat. No. 8,950,194 B2, a portion of the evaporating gas from the cryocontainer may be conducted along the cooler when the cooler is shut off, for example during transport, and thereby reduce the thermal burden on the cooling arm.

According to German Patent No. DE 10 2014 218 773 A1, a cavity in a cryostat between the inside of the neck tube and the cooling arm of a cooling head may be filled with a gas, such as helium. In normal operation, the lowermost cooling stage of the cooling arm is near the object being cooled; for example, a good thermal coupling may be produced by a contact between the object to be cooled and the lowermost cooling stage for a small quantity of liquid helium in the cavity. Upon loss of the cooling, the gas pressure in the cavity rises as a result of warming; liquid helium in the cavity evaporates. The movably mounted cooling head is moved by the rising gas pressure in the cavity in a direction away from the object to be cooled, which decreases the thermal coupling between the cooling arm and the object to be cooled.

With this cryostat, the thermal load can be decreased by a cooling arm upon loss of the active cooling, but the design expense is relatively large due to the movable suspension of the cold head. Furthermore, due to the high gas pressure in the cavity, a thermal coupling persists that is not insignificant.

SUMMARY

The techniques presented herein provide a cryostat arrangement in which the thermal load can be decreased in a simple manner by a cooling arm in the event of a loss of the active cooling.

The cryostat arrangement comprises a pump device, to which the cavity is connected, wherein the cavity is configured to be evacuated upon failure of the cooling function of the cold head.

According to an example, the cooling arm may be surrounded with a cavity, which in normal operation is filled at least partly with a first cryogenic fluid to thermally couple the cooling arm to the object to be cooled. The thermal coupling of the cooling arm to the object to be cooled occurs through the cavity using the first cryogenic fluid. The heat transfer is supported primarily by convection and thermal conduction in the cryogenic fluid. Good thermal conduction can be achieved with liquefied cryogenic fluid, for which a corresponding gas pressure can be adjusted (e.g., with heaters in suitable places). The cavity is sealed off from the object to be cooled, that is, the first cryogenic fluid cannot penetrate the object to be cooled. However, in some regards, an outer wall of the object to be cooled can also border the cavity; but the first cryogenic fluid does not communicate with any second cryogenic fluid in the object to be cooled (such as a helium tank).

Upon loss of active cooling, this cavity can be evacuated with the pump device. With a vacuum in the cavity (usually 1 mbar or less, often also $10^{-2}$ mbar or less), the thermal coupling between the cooling arm and the object to be cooled is interrupted or at least greatly reduced (typically by 70% or more, often by 95% or more, preferably by 99% or more); the vacuum has a thermal insulating effect.

In the absence of the first cryogenic fluid, the closed cavity becomes the insulating vacuum. Of the three heat transport mechanisms by the cavity (thermal conduction, convection, thermal radiation), the two generally dominant ones in normal operation (thermal conduction and convection) are lost in the evacuated state/malfunctioning mode, and thermal radiation remains as the only heat transport mechanism of practically relevant importance. In some aspects, the radiative heat input may be further reduced by baffles or open radiation shields, which, in normal operation, are bathed by the first cryogenic fluid and therefore adversely affect the thermal contact only slightly.

Consequently, the cooling arm (which is no longer being actively cooled, and whose temperature gradually rises, possibly up to room temperature) only results in a relatively slight thermal load on the object being cooled. Due to evacuation of the cavity, which is sealed off from the object being cooled, the object being cooled will not be affected, and in particular any second cryogenic fluid used in the object to be cooled (such as a helium bath) will not be pumped out.

The first cryogenic fluid is typically gaseous or partly gaseous and partly liquid. The first cryogenic fluid is typically helium. The same may also hold for the second and third cryogenic fluid (see below).

The cooling arm in normal operation is directly or indirectly thermally coupled to the first cryogenic fluid in the cavity, and is thereby also indirectly thermally coupled to the object to be cooled. In a malfunction (failure of the cooling device), the first cryogenic fluid may be pumped out, so that the thermal coupling of the cooling arm (which is warming up) to the object to be cooled is eliminated or at least greatly reduced.

The cooling arm typically does not touch the first thermal coupling component (and also typically any second thermal coupling component, see below) either in normal operation or in a malfunction.

The cooling arm may be surrounded directly or indirectly by the cavity (for example, in a cooling arm container, which in turn is surrounded by the cavity). Furthermore, the cooling arm or a portion thereof may be arranged directly or indirectly in the neck tube (for example, in a cooling arm container arranged at least partly in the neck tube).

Examples in which the Cooling Arm is Arranged Directly in the Cavity Being Evacuated In an example, the cryostat comprises a cooling arm of the cold head that is arranged directly in the cavity. Using this arrangement, the thermal mass of structures (which become warm when the active cooling of the cooling arm fails) can be minimized. Furthermore, this construction usually enables good thermal coupling of the cooling arm and the object to be cooled in normal operation. The cavity may be arranged on the outside or also entirely through the neck tube.

In another example, it is provided that an outer enclosure of the cavity is spaced apart from an inner wall of the neck tube, and an intermediate space between the inner wall of the neck tube and the outer enclosure is formed to be open toward the object to be cooled. The object to be cooled, and toward which the intermediate space is open, can be a cryocontainer, which is filled at least partly with a second cryogenic fluid. In particular, the intermediate space can comprise a feed line for the second cryogenic fluid being introduced or returned. The intermediate space between the enclosure and the inner wall of the neck tube may be used for introducing or returning the second cryogenic fluid into the cryocontainer. This enables a cooling of the second cryogenic fluid, as well as its condensation on the cold outside of the enclosure. Furthermore, the enclosure is spaced apart from the inside of the neck tube, so that a transmission of any mechanical vibrations from the enclosure to the rest of the cryostat is impeded.

In another example, the cold head including the enclosure of the cavity is mounted to be mechanically decoupled from the rest of the cryostat including the object to be cooled, wherein a flexible membrane is provided, which seals off the intermediate space from the surroundings. Due to the mechanically decoupled mounting, an input of mechanical vibrations from the cold head (for example, based on pressure pulses of the working gas of a pulse tube refrigerator) into the cryostat is prevented or at least reduced. In the intermediate space, due to the connection to the cryocontainer, the second cryofluid may be held under a gas pressure close to the pressure of the surroundings (pressure difference is usually <50 mbar or <25 mbar, usually a slightly higher gas pressure prevailing in the intermediate space), so that the flexible membrane is practically free of stress and transmission of mechanical vibrations to the cryostat also is avoided. The flexible membrane is not mechanically affected by an evacuating of the cavity.

In another example, a modification is provided in which the enclosure of the cavity comprises an elastic length-adjustable section and an intermediate contact element for contacting an upper cold stage of the cooling arm, so that in normal operation the intermediate contact element lies against the upper cold stage on the cooling arm, and when the cavity is evacuated a portion of the enclosure including the intermediate contact element is displaced due to an altered pressure difference between the cavity and the cryocontainer, so that the upper cooling stage no longer lies against the intermediate contact element. Using this approach, the thermal decoupling can be improved in the event of a malfunction. The intermediate contact element typically lies opposite a shield contact element of a radiation shield of the vacuum container for the thermal coupling, and in some aspects, a mutual spacing is less in the normal operation than in the event of a malfunction with an evacuated vacuum container due to the displacement of the portion of the enclosure. Also a mutual contact between the shield contact element and the intermediate contact element may be present under normal operation.

Examples in which the Cooling Arm is Arranged Indirectly in the Evacuated Cavity In another example, the cooling arm is arranged directly in a cooling arm container, and the cavity is formed around the cooling arm container, wherein the cooling arm container is sealed off fluid-tight from the cavity, and a second thermal coupling component is provided, suitable for the thermal coupling of the first cryogenic fluid in the cavity to the interior of the cooling arm container, wherein a third cryogenic fluid is arranged in the cooling arm container. In this example, the interior of the cooling arm container is separate from the cavity, so that manipulations on the cooling arm are easier, for example, during repairs. A gas pressure can be established in the cooling arm container independently of the gas pressure in the cavity. Likewise, a mechanical decoupling of the cooling arm from the rest of the cryostat including the cavity or its enclosure, is simplified.

In another example, the cold head is mounted so as to be mechanically decoupled from the wall of the cooling arm container and the rest of the cryostat arrangement including the object to be cooled, wherein a flexible membrane spans an annular gap between the wall of the cooling arm container and the cold head and thus seals off the interior of the cooling arm container from the surroundings. The mechanically decoupled mounting prevents or reduces the input of mechanical vibrations (for example, resulting from pressure pulses of a working gas in a pulse tube refrigerator) into the cryostat. In the cooling room container the third cryofluid may be held under a gas pressure close to the pressure of the surroundings (pressure difference usually <50 mbar or <25 mbar, usually a slightly higher gas pressure prevailing in the cooling arm container), so that the flexible membrane is practically free of stress and a transmission of mechanical vibrations to the cryostat also is avoided. The flexible membrane is not mechanically affected by an evacuating of the cavity.

Various Examples

In an example, the first thermal coupling component and/or the second thermal coupling component is configured as a heat exchanger, wherein the heat exchanger comprises surface-enlarging structures, such as fins. Due to the heat exchanger, the thermal coupling between the object to be cooled and the first cryogenic fluid in the cavity can be improved. The first heat exchanger is typically based on a material with good thermal conductivity (at cryogenic temperatures), such as copper, and it typically has physical contact with both the first cryogenic fluid in the cavity and the object to be cooled (a second cryogenic liquid); the same holds for the second heat exchanger.

In another example, the object to be cooled is a cryocontainer, and an outer enclosure of the cavity protrudes into an upper region of the cryocontainer. If a cooling arm container is provided, this may protrude into the upper region of the cryocontainer. In this example, a large surface of thermal contact can be provided between the first cryogenic fluid in the cavity and the cryocontainer or a second cryogenic fluid contained therein. Furthermore, a small structural height can be achieved.

In another aspect, a first cryogenic liquid is arranged in the cavity in normal operation, a second cryogenic liquid is arranged in the cryocontainer, and the outer enclosure of the cavity is submerged in the second cryogenic liquid in the cryocontainer. The two cryogenic liquids allow good thermal coupling. Basically, the first thermal coupling component may be formed by the portion of the outer enclosure submerged in the second cryogenic liquid in the cryocontainer. For example, the submerged portion of the outer enclosure is wetted with cryogenic liquid on both sides at least in one section.

In a further example, in which a cavity directly surrounds the cooling arm, at least a lowermost cold stage of the cooling arm is submerged in the first cryogenic liquid in the cavity. Using this approach, the thermal coupling of the lower cold stage (cooling stage) to the object to be cooled may be improved.

In another example, with the cooling arm in a cooling arm container, which in turn is surrounded by the cavity, the cooling arm container is submerged in the first cryogenic liquid in the cavity, and a third cryogenic liquid is arranged in the cooling arm container, in which at least a lower cold stage of the cooling arm is submerged. Also using this approach the thermal coupling of the lower cold stage (cooling stage) to the object to be cooled can be improved.

Basically, the second thermal coupling component may be formed by the portion of the cooling arm container submerged in the first cryogenic liquid in the cavity. In some examples, the submerged portion of the cooling arm container is wetted on both sides by cryogenic liquid at least in one section.

In another example a monitoring device is provided, which monitors the cooling function of the cold head, and is configured to automatically activate the pump device upon failure of the cooling function of the cold head, so that the cavity is evacuated. In this way, the heat load due to the cooling arm becoming warm can be reduced at an early stage and thus the possible hold time can be increased and the object being cooled can be held at cryogenic temperature (and in particular a quench can be avoided in a superconducting magnet coil system). The monitoring device can monitor a temperature at a suitable location of the cooling arm, or also make suitable electrical verification measurements on the active cooling system. As a rule, the monitoring device also opens a shutoff valve between the pump device and the cavity (for example, in a pump line) when it activates the pump device.

In an example, the pump device is configured as a sorption pump, whose pumping cold surfaces are thermally coupled to the object to be cooled, wherein a connection line extends from the cavity to the pumping cold surfaces entirely inside the vacuum container. The pumping cold surfaces are formed for example in an activated charcoal or zeolite container. The sorption pump (or "cryopump") has the pumping cold surfaces or its container typically in physical contact with the object to be cooled. The connection line (pump line) from the cavity to the pumping cold surfaces in the container (sorption container) is preferably formed entirely inside the vacuum container and typically comprises a heat exchanger, which first cools down the aspirated gas before reaching the container.

In another example, the object to be cooled is a cryocontainer, which is filled at least partly with a second cryogenic fluid, wherein a superconducting magnet coil system is arranged in the cryocontainer. This cryostat is configured to enable a reliable and uniform cooling of structures arranged in the cryocontainer. The cryostat configuration also enables an emergency cooling by replenishing of liquid helium from an outside supply. The cavity with the first cryogenic fluid is separated from the cryocontainer with the second cryogenic fluid in a fluid-tight manner. The first and second cryogenic fluid, however, may be chosen to be the same, such as helium. Typically, the first thermal coupling component separates the cavity from the cryocontainer.

In an alternative embodiment, the object to be cooled is a superconducting magnet coil system, which is arranged directly in the vacuum container. The magnet coil system (or another object to be cooled) in this "cryo-free" system is arranged directly in the vacuum of the vacuum container, which simplifies the construction of the cryostat. It should be noted that the magnet coil system may comprise a housing; however, no cryogenic fluid is provided in this housing for cooling.

Operating Method

Methods for operating a cryostat are provided, in particular a cryostat as described herein, with a vacuum container and an object to be cooled, and in particular a superconducting magnet coil system or a cryocontainer. In some aspects, the method comprises providing a first thermal coupling component, suitable for the thermal coupling of a first cryogenic fluid in a cavity to the object to be cooled,
wherein the object to be cooled is arranged inside a vacuum container comprising a neck tube, the neck tube leading to the object to be cooled,
wherein a cooling arm of a cold head is arranged at least partly in the neck tube,
wherein a closed cavity is formed around the cooling arm, sealed off fluid-tight from the object to be cooled, operating the cryostat under normal operation with an at least partial filling of the cavity with a first cryogenic fluid to cool the object inside the vacuum container, and evacuating the cavity upon failure of the cooling function of the cold head.

Due to evacuating, the first cryogenic fluid is removed from the cavity, whereby the coupling of the cooling arm or the cold head to the object being cooled is eliminated or greatly reduced. Typically, the cavity remains evacuated until the cooling function of the cold head is again restored.

Further benefits of the invention will emerge from the specification and the drawings. Likewise, the abovementioned features and those further presented below may be used alone or together in any given combination according to the invention. The embodiments depicted and described are not to be understood as a final listing, but instead are in the nature of examples to describe the invention.

BRIEF DESCRIPTION OF THE DRAWINGS

The invention is represented in the drawings and will be explained in further detail with the aid of examples. The figures show the following.

DETAILED DESCRIPTION

Figure 1:
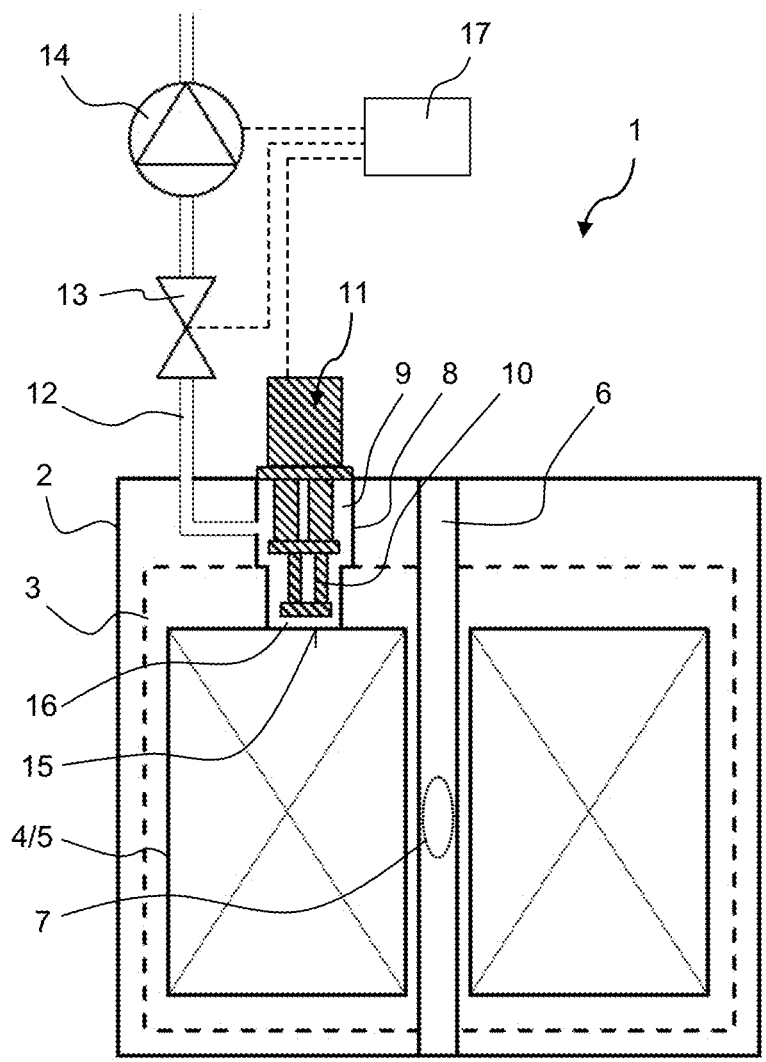
FIG. 1 is a schematic cross section of a first example of a cryostat arrangement, with a superconducting magnet coil directly in the vacuum as the object to be cooled.

FIG. 1 shows schematically a first embodiment of a cryostat 1 comprising a vacuum container 2, in whose interior a vacuum is established. In vacuum container 2 there is arranged a thermal radiation shield 3 (shown by dashed lines), which surrounds a superconducting magnet coil system 5 shown as object 4 to be cooled. The magnet coil system 5 is arranged directly in the vacuum of the vacuum container 2.

The cryostat 1 is provided with a room temperature bore 6, through which a sample volume 7 at the center of the magnet coil system 5 is accessible. In the sample volume 7, a strong, static, approximately homogeneous magnetic field $B_0$ is present, which may be used for NMR measurements on a sample in the sample volume 7 with NMR resonators (not shown).

Through the vacuum container 2 a neck tube 8 leads to the object 4 to be cooled. In the embodiment shown, the neck tube 8 forms the enclosure of a cavity 9, which directly surrounds a cooling arm 10 of a cooling head 11 of an active cooling system of the cryostat 1.

The cavity 9 is connected via a pump line 12 and a shutoff valve 13 to a pump device 14, with which the cavity 9 can be evacuated. For actuating the shutoff valve 13 and the pump device 14, a monitoring device 17 is provided, which also receives temperature information from the cooling head 11. When a limit temperature is exceeded (such as 10 K at a lowermost cold stage of the cooling arm 11) monitoring device 17 automatically opens the control valve 13 and activates the pump device 14.

During normal operation of the cryostat 1, the cavity 9 is at least partly filled with a first cryogenic fluid (not shown, but see, e.g., FIG. 3 and the following figures), which couples the cooling arm 10 to the object 4 to be cooled. The thermal coupling component 15 may be a top side of the object 4 to be cooled, which forms part of the enclosure of the cavity 9. In the event of a malfunction in the active cooling of the cooling arm 10, the cavity 9 is evacuated with the pump device 14. Due to the evacuated clearance 16 between the lower end of the cooling arm 10 and the thermal coupling component 15, a thermal decoupling occurs between the cooling arm 10 and the object 4 being cooled upon evacuation. For the processes associated with the thermal decoupling, also see FIG. 3 to FIG. 8 below.

Figure 2:
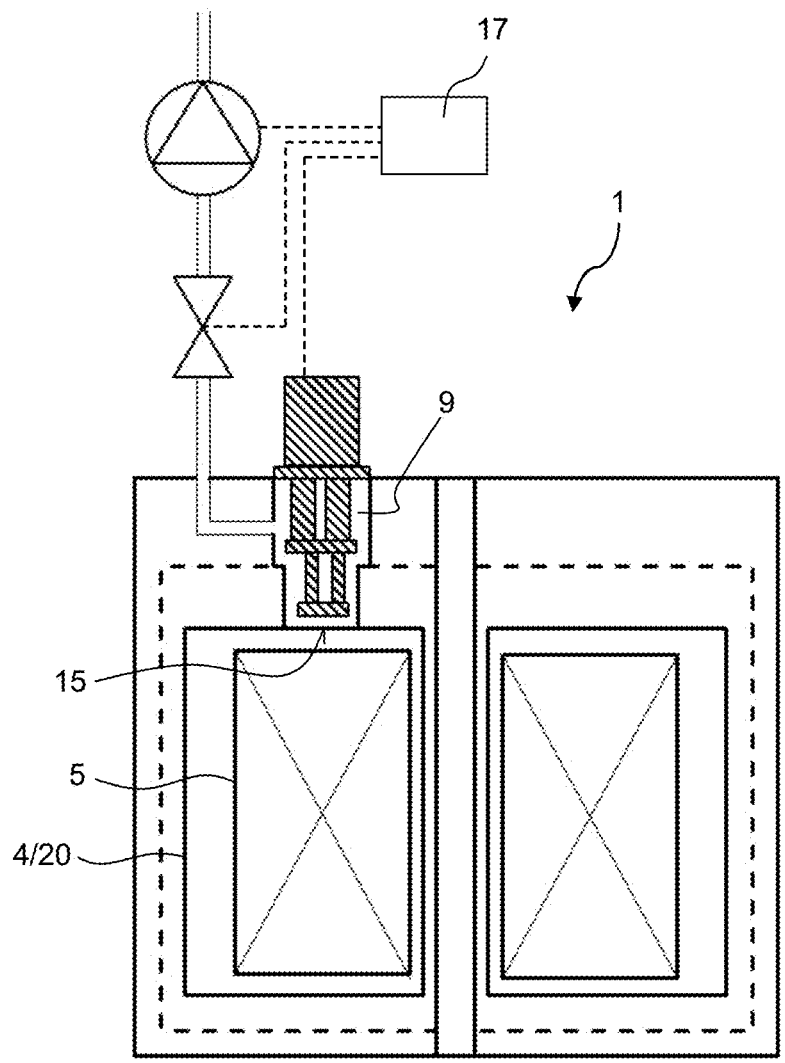
FIG. 2 is a schematic cross section of a second example of a cryostat arrangement, with a cryocontainer as the object to be cooled, with a superconducting magnet coil contained in the cryocontainer.

FIG. 2 shows a second embodiment of a cryostat 1, corresponding to the first embodiment of FIG. 1; therefore, only the important differences will be explained.

In the second embodiment, the object 4 to be cooled is fashioned as a cryocontainer 20, inside of which is arranged a superconducting magnet coil system 5. Furthermore, a second cryogenic fluid is arranged in the cryocontainer 20, here, partly liquid and partly gaseous helium (not shown). The superconducting magnet coil system 5 is typically submerged at least partly in the liquid helium.

The first thermal coupling component 15 is formed by a portion of the top wall of the cryocontainer, which bounds the cavity 9.

Figure 3:
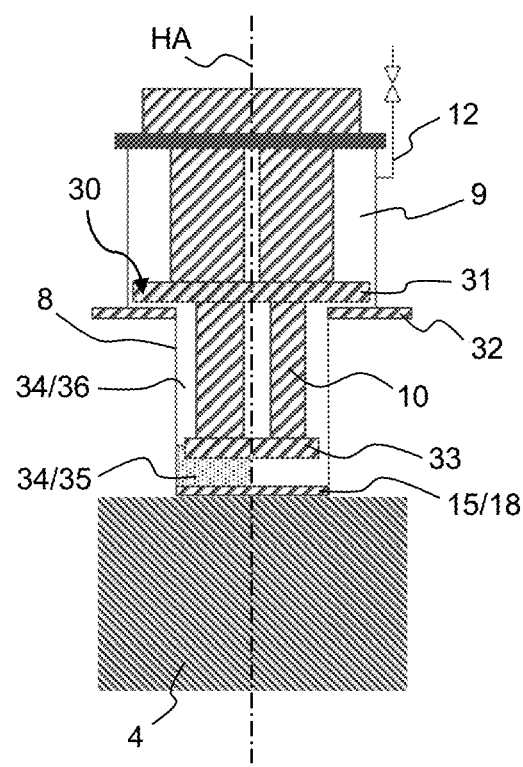
FIG. 3, a schematic cross section through the region of the neck tube of a cryostat with normal operation shown at the left and malfunctioning state shown at the right with the cavity pumped out, shows a magnet coil arrangement as the object to be cooled and a cavity directly surrounding the cooling arm.

FIG. 3 shows more closely the region of the neck tube 8 of a cryostat 1, substantially corresponding to the example of FIG. 1, with a fluid-tight cavity 9 directly surrounding the cooling arm 10. At left is shown the condition in normal operation, and at right the condition in a malfunction (the latter applies to all of FIGS. 3 to 8 and 10).

The cooling arm 10 has an upper cold stage (cooling stage) 30 with an upper contact element 31, which lies opposite a shield contact element 32 of a radiation shield at a slight axial offset (with respect to the neck tube axis HA). Furthermore, the cooling arm 10 has a lower cold stage (cooling stage) 33, lying opposite the thermal coupling component 15 at a slight axial offset. The coupling component 15 is a heat exchanger 18, whose top side bounds the cavity 9 at the bottom and whose bottom side lies against the object 4 to be cooled.

In normal operation (at left) a first cryogenic fluid 34 is stored in the cavity 9, being present in a lower region of the cavity 9 as the first cryogenic liquid 35, and in the space above it as the first cryogenic gas 36, typically under approximately normal pressure (around 1 bar). The lower cold stage 33 is submerged in the first cryogenic liquid 35. A strong thermal coupling is established between the lower cold stage 33 of the cooling arm 10 and the thermal coupling component 15 or the object 4 to be cooled with heat transfer coefficient $\alpha$. The gaseous cryogenic fluid 36 furthermore ensures a tolerable thermal coupling between the shield contact element 32 and the upper contact element 31.

In a malfunction (at right), upon failure of the active cooling, the cavity 9 is evacuated via the pump line 12 (typically to less than 1 mbar). The first liquid cryogenic fluid 35 also evaporates. The vacuum between the lower cold stage 33 and the thermal coupling component 15 acts as a strong thermal insulator, and the heat transfer coefficient $\alpha'$ falls to less than $\frac{1}{100}$ of the previous heat transfer coefficient $\alpha$. The thermal coupling between the shield contact element 32 and the upper contact element 31 is also greatly decreased by the intermediary evacuated axial gap. The object 4 being cooled remains cold longer, below a critical temperature of the superconducting wire contained therein.

Figure 4:
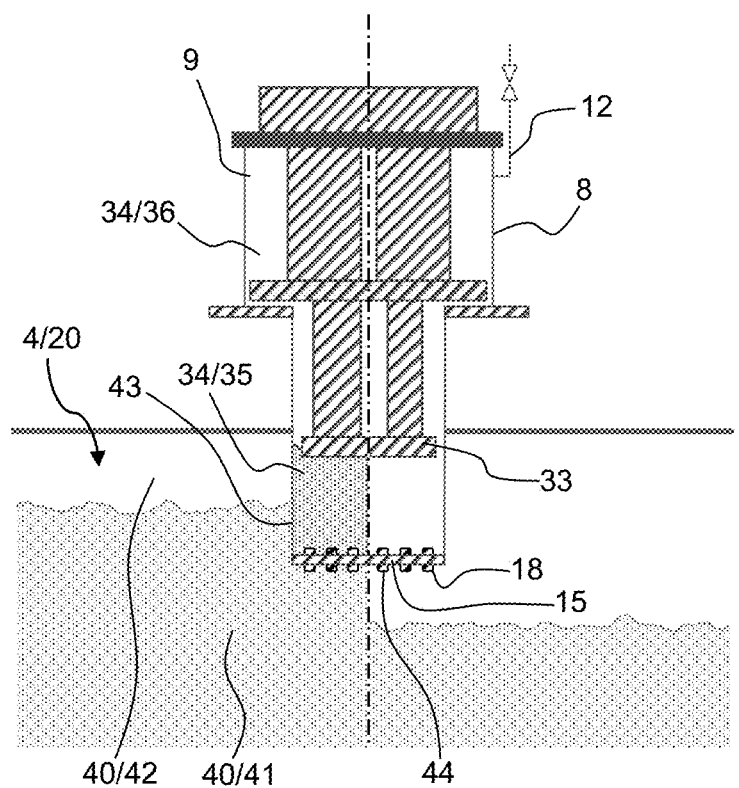
FIG. 4, a schematic cross section through the region of the neck tube of a cryostat with normal operation shown at the left and malfunctioning state shown at the right with the cavity pumped out, shows a cryocontainer as the object to be cooled and a cavity directly surrounding the cooling arm.

FIG. 4 shows the region of a neck tube 8 of a cryostat, similar to the embodiment shown in FIG. 3, so that only important differences will be discussed.

The object 4 to be cooled is a cryocontainer 20, which is filled with a second cryogenic fluid 40, being partly present as the second cryogenic liquid 41, and partly as the second cryogenic gas 42. In the cryocontainer 20, a superconducting magnet coil is present but not shown. The gas pressure in the cryocontainer 20 can be adjusted by a heater (not shown) in the cryocontainer 20.

An enclosure 43 of the cavity 9 in normal operation (at left) is submerged in the second cryogenic liquid 41. The portion of the enclosure 43 submerged in the second cryogenic liquid 41 may be the thermal coupling component 15; in addition, the bottom of the enclosure 43 is fashioned as a heat exchanger 18 with surface-enlarging fins 44. In the cavity 9 once again the first cryogenic liquid 35 rises up to the lower cold stage 33. In this way, a good thermal coupling of the second cryogenic liquid 41 is achieved via the thermal coupling component 15 or the enclosure 43 and via the first cryogenic liquid 35 up to the lower cold stage 33 of the cooling arm 10.

In a malfunction, the cavity 9 is evacuated via the pump line 12, whereupon the first cryogenic liquid 35 evaporates in the cavity 9. When the level of cryogenic liquid 41 in the cryocontainer 20 drops due to evaporation from the cryocontainer 20 to below the height of the bottom of the enclosure 43, the thermal coupling between the cryocontainer 20 and the cooling arm 10 or the lower cold stage 33 becomes slight, since the vacuum in the cavity 9 conducts little or no heat, and the second gaseous cryogenic fluid 42 conducts heat significantly worse than the second liquid cryogenic fluid 41.

It should be noted that in one variant the first cryogenic fluid 34 may also remain entirely gaseous in the cavity 9. In this case, the gas pressure in the cavity 9 must be adjusted correspondingly low, so that no condensation occurs due to the temperature of the lower cold stage 33.

Figure 5:
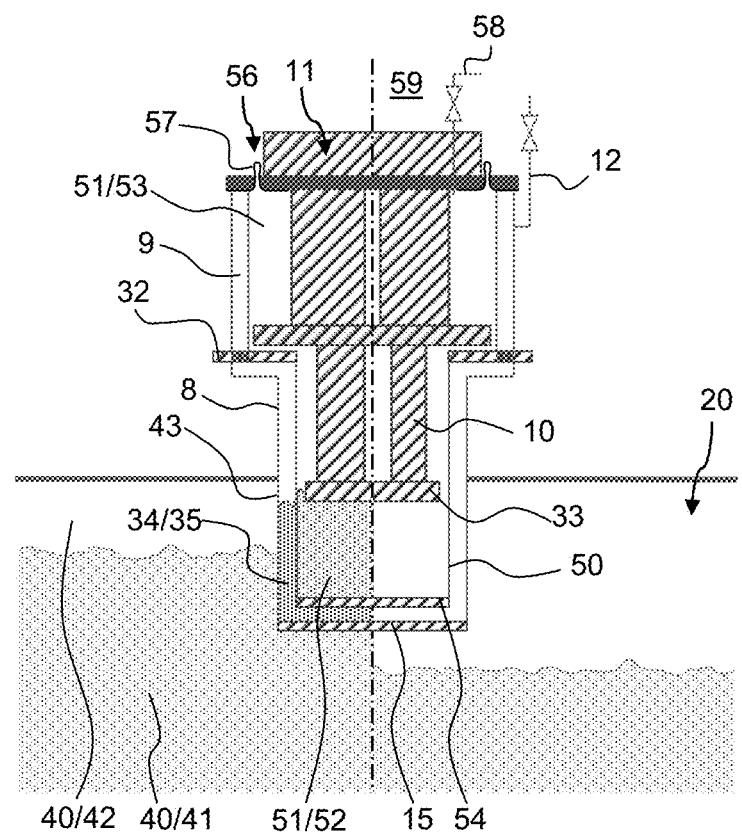
FIG. 5, a schematic cross section through the region of the neck tube of a cryostat with normal operation shown at the left and malfunctioning state shown at the right with the cavity pumped out, shows a cooling arm container directly surrounding the cooling arm and a cavity surrounding the cooling arm container.

The example shown in FIG. 5 shows the region of a neck tube 8 of a cryostat in an example similar to that shown in FIG. 4, so that the main differences will be discussed below.

In the embodiment, the neck tube 8 on the outside forms part of the enclosure 43 of the cavity 9, and on the inside the cavity 9 is bounded by the wall of a cooling arm container 50, containing the cooling arm 10. Thus, the cavity 9 indirectly surrounds the cooling arm 10.

The cavity 9 in normal operation (at left) is filled with the first cryogenic fluid 34, partly as the first cryogenic liquid 35, so that the cooling arm container 50 is submerged in the first cryogenic liquid 35. The enclosure 43 in turn is submerged in the second cryogenic liquid 41 in the cryocontainer 20. In the cooling arm container 50 there is a third cryogenic fluid 51, which is partly present as the third cryogenic liquid 52 and partly as the third cryogenic gas 53 (at around 1 bar). The third cryogenic fluid 51 may be filled via the fluid entrance/overpressure relief 58 into the cooling arm container 50 or vented out from this; an overpressure valve (notshown) may be provided at the fluid entrance/ overpressure relief 58. The lower cold stage 33 of the cooling arm 10 is submerged in the third cryogenic liquid 52. In normal operation, a good thermal coupling thus exists for the second cryogenic liquid 41 via the enclosure 43 or the first thermal coupling means 15, the first cryogenic liquid 35, the wall of the cooling arm container 50 or a second thermal coupling means 54 and the third cryogenic liquid 52 of the cooling arm 10 or lower cold stage 33.

In a malfunction (at right), the cavity 9 which surrounds the cooling arm container 50 is evacuated; it should be noted that the shield contact element 32 has apertures (such as axial bores), so that the lower portion of the cavity 9 may also be evacuated via the pump line 12. By the warming of the cooling arm 10, the third cryogenic liquid 52 contained in the cooling arm container 50 is warmed and evaporates; there remains some gas under normal pressure. The level of the second cryogenic liquid 41 in the cryocontainer 20 also drops due to warming and evaporation. Then the thermal coupling between cryocontainer 20 and cooling arm 10 is only still slight, since the cryogenic gas 42 in the cryocontainer 20 as well as the vacuum in the cavity 9 are comparatively poor conductors of heat. The cavity 9 is also called a thermal switch.

In this embodiment, an annular gap 56 between the cooling head 11 and the wall of the cooling arm container 50 may be spanned by a flexible membrane 57, in order to seal off the interior of the cooling arm container 50 from the surroundings 59. Due to the gas pressure in the cooling arm container 50 of around 1 bar (i.e., corresponding to the pressure of the surroundings), the flexible membrane 57 can remain approximately free of mechanical stress, so that the cold head 11 in combination with a vibration-isolating mounting can be mechanically decoupled from the rest of the cryostat rather well. In this way, low-perturbation and high-resolution NMR measurements are readily possible.

Figure 6:
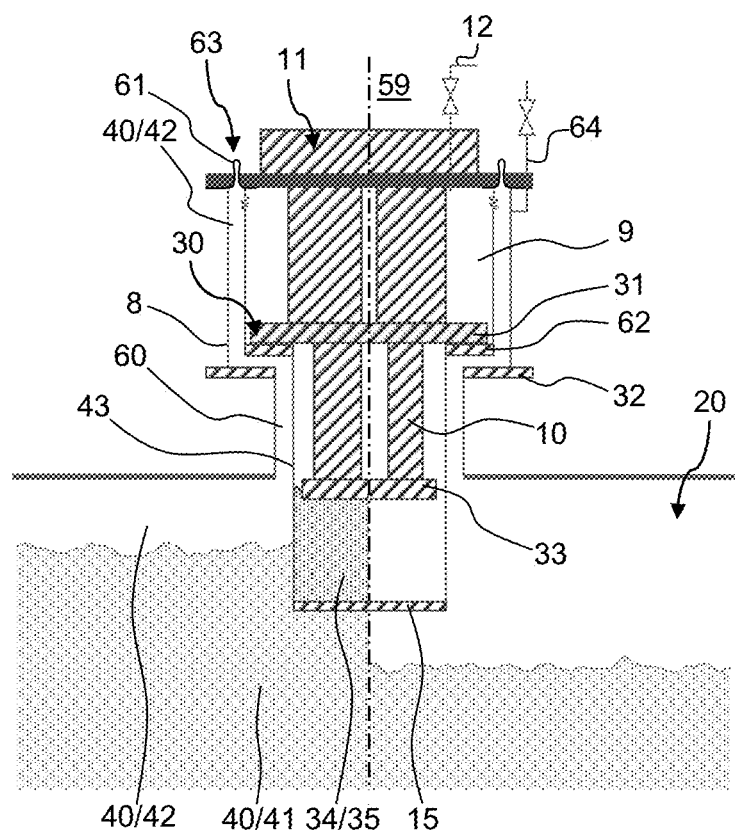
FIG. 6, a schematic cross section through the region of the neck tube of a cryostat with normal operation shown at the left and malfunctioning state shown at the right with the cavity pumped out, shows a cavity directly surrounding the cooling arm and intermediate space between the enclosure of the cavity and the inner wall of the neck tube, with direct shield connection.

FIG. 6 shows an example similar to FIG. 4, so once again the main differences will be discussed. The cavity 9 surrounds the cooling arm 10 directly, with the enclosure 43 of the cavity 9 being spaced apart from the inner wall of the neck tube 8 in the radial direction.

This produces an intermediate space 60 between the enclosure 43 and the inner wall of the neck tube 8. This intermediate space 60 is open towards the cryocontainer 20 at the bottom, so that the intermediate space 60 is filled with the second cryogenic fluid 40, namely, with the second cryogenic gas 42 (at around 1 bar). Cryogenic fluid (e.g., helium) may be filled into or removed from the intermediate space 60 via the feed line 64, and it can then condense on the outside of the enclosure 43 and drip down into the cryocontainer 20 (alternatively, cryogenic fluid 40 may also be returned at a different site in the cryostat, i.e., not along the cooling arm 10, and with a countercurrent heat exchanger, which utilizes the enthalpy of the helium pumped out from a Joule-Thomson refrigerator in order to cool the returned helium, notshown).

In normal operation (at left) the cavity 9 is filled with the first cryogenic fluid 34, in part as the first cryogenic liquid 35. In a malfunction (at right), the cavity 9 is evacuated via the pump line 12, in order to reduce the thermal coupling of the cryocontainer 20 to the cooling arm 10, as discussed for FIG. 4.

The intermediate space 60, relative to the surroundings 59 (at top), is covered by a flexible membrane 61, in order to seal off an annular gap 63 between cold head 11 (or upper portion of the enclosure 43) and the neck tube 8 (or the rest of the cryostat). Since in the intermediate space 60 the gas pressure is 1 bar, approximately equal to the pressure of the surroundings, the flexible membrane 61 can be kept practically free of mechanical stresses, which reduces the transmittal of mechanical vibrations. When the cold head 11 is mounted in a vibration-isolating manner, NMR measurements are then possible which are practically free of perturbation by mechanical vibrations.

In the configuration shown, the upper contact element 31 of the upper cold stage 30 lies against an intermediate contact element 62 of the enclosure 43. This intermediate contact element 62 lies opposite the shield contact element 32. In normal operation and in a malfunction a comparatively strong thermal coupling is established between the radiation shield at the shield contact element 32 and the upper cooling stage 30 at the cooling arm 10.

Figure 7:
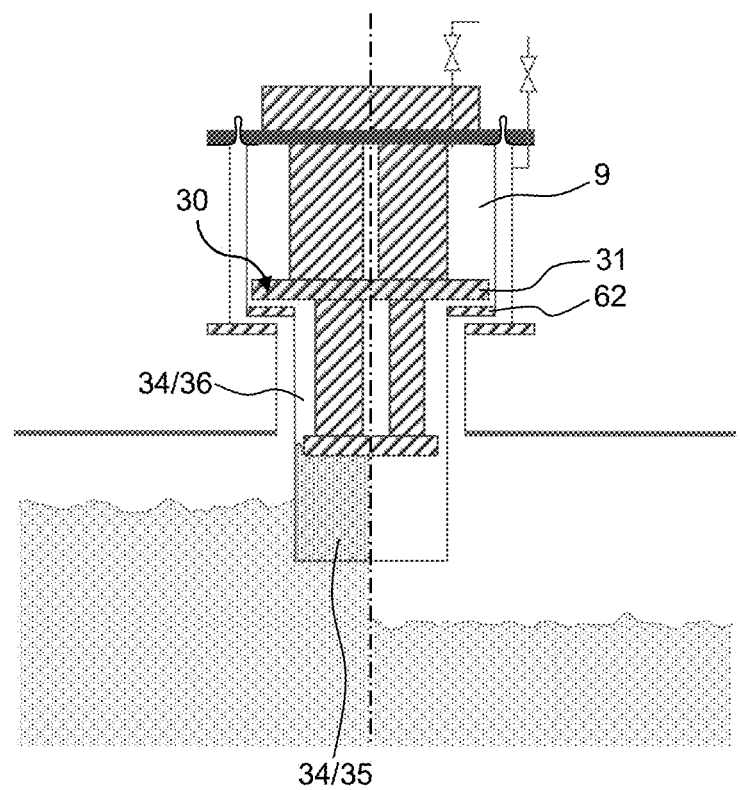
FIG. 7, a schematic cross section through the region of the neck tube of a cryostat with normal operation shown at the left and malfunctioning state shown at the right with the cavity pumped out, shows a cavity directly surrounding the cooling arm and intermediate space between the enclosure of the cavity and the inner wall of the neck tube, with a shield connection via the first cryofluid.
Figure 8:
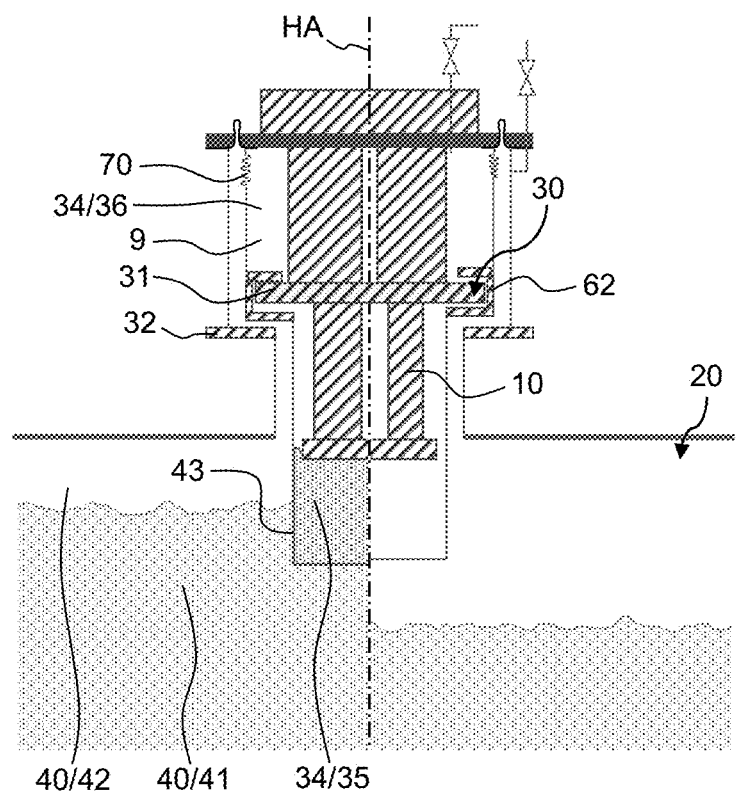
FIG. 8, a schematic cross section through the region of the neck tube of a cryostat with normal operation shown at the left and malfunctioning state shown at the right with the cavity pumped out, shows a cavity directly surrounding the cooling arm, with an elastic length-adjustable section of the enclosure of the cavity, and an intermediate space between the enclosure of the cavity and the inner wall of the neck tube.

Alternatively, it is also possible, as shown in the embodiment of FIG. 7, which corresponds mostly to the configuration of FIG. 6 so that only the major differences will be discussed, to arrange the upper cold stage 30 at a spacing (here, axially) from the intermediate contact element 62. In this case, the thermal coupling between upper cooling stage 30 or its upper contact element 31 and the intermediate contact element 62 depends on the gas pressure in the cavity 9. In normal operation, the first cryogenic fluid 34, namely, the first cryogenic gas 36, ensures a tolerable thermal coupling. In a malfunction, with the cavity 9 evacuated, the thermal coupling is slight as a result of the vacuum (in the clearance) between upper contact element 31 and intermediate contact element 62.

In the embodiment shown in FIG. 8, which once again resembles the embodiments of FIG. 6 and FIG. 7 so that the primary differences will be explained, the enclosure 43 has an elastically length-adjustable section 70, so that the overall extension of the enclosure 43 in the axial direction (see the neck tube axis HA) into the cryocontainer 20 is variable. Furthermore, the enclosure 43 in the configuration shown has an intermediate contact element 62 reaching inwardly around the upper contact element 31 of the upper cooling stage 30.

In normal operation (at left), a top side of the upper contact element 31 of the upper cooling stage 30 of the (stationary) cooling arm 10 lies at the top against the intermediate contact element 62, so that a good thermal contact is produced between the upper cooling stage 30 and the intermediate contact element 62. Furthermore, the lower portion of the intermediate contact element 62 lies opposite the shield contact element 32 at a short axial distance, so that a good thermal contact between the intermediate contact element 62 and the radiation shield also exists (via the second cryogenic gas 42 of the second cryogenic fluid 40). The comparatively high gas pressure of the first cryogenic fluid 34 in the cavity 9 presses the lower portion of the enclosure 43 downward into the (stationary) cryotank 20.

In a malfunction (at right) the cavity 9 is evacuated. The elastically length-adjustable section 70 contracts on account of the vanishing gas pressure in the cavity 9, and the lower portion of the enclosure 43 including the intermediate contact element 62 is lifted somewhat. As a result, the bearing contact between the upper contact element 31 and the intermediate contact element 62 is lost. On the other hand, the mutual spacing of shield contact element 32 and intermediate contact element 62 increases. In this way, the thermal coupling of upper cooling stage 30 and radiation shield at the shield contact element 32 is greatly decreased. Accordingly, the heat load of the cryostat due to the warming of the cooling arm 10 is further reduced.

Figure 9:
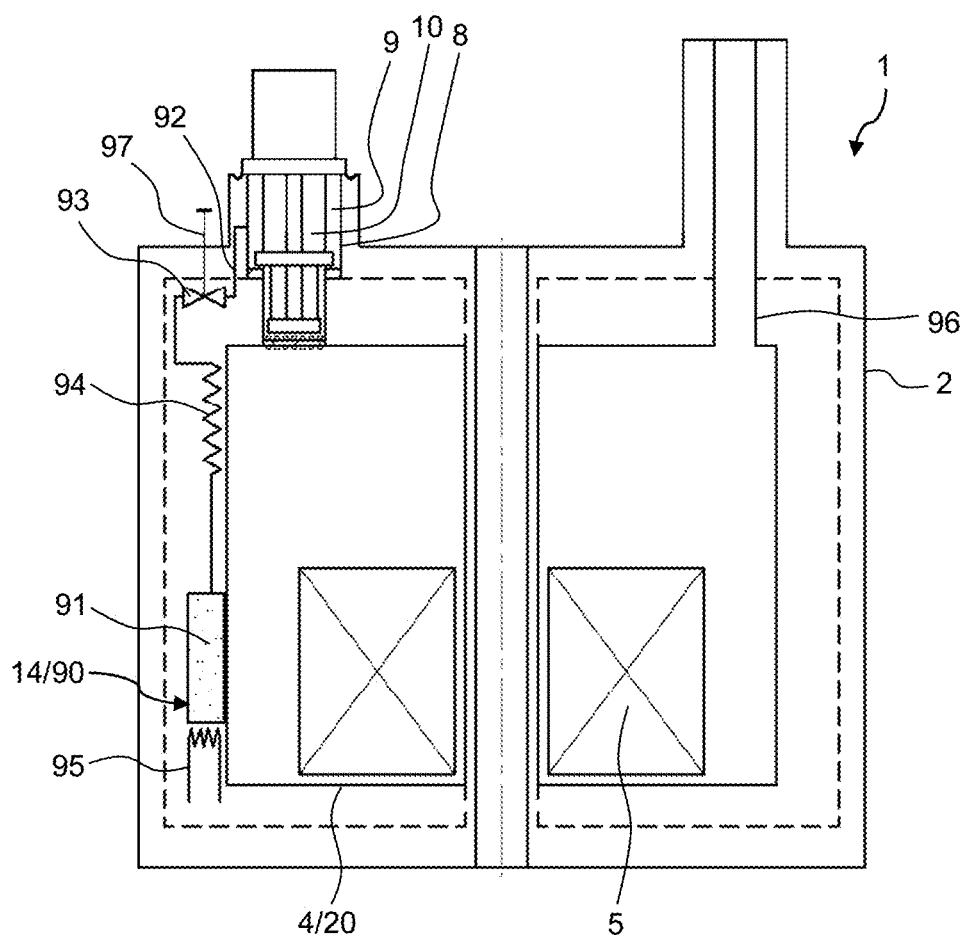
FIG. 9 is a schematic cross section of a third embodiment of a cryostat arrangement, with a sorption pump whose pumping cold surfaces are thermally coupled to the object to be cooled.

FIG. 9 shows a third embodiment of a cryostat 1, similar to the representation in FIG. 2; the major differences will be explained primarily.

In this example, the pump device 14 is configured as a sorption pump 90, comprising a container 91 filled with activated charcoal or zeolite, so that a large adsorption surface for cryogenic fluid is formed. The container 91 is arranged on the outside of the object 4 to be cooled, here, a cryocontainer 20, in which a superconducting magnet coil layout 5 is positioned. Accordingly, the container 91 is at cryogenic temperature and provides pumping cold surfaces. From the cavity 9, which directly surrounds the cooling arm 10 and is formed substantially by the neck tube 8, a connection line (pump line) 92 leads across a shutoff valve 93 and a heat exchanger 94 to the container 91. The connection line 92 extends inside the vacuum container 2, so that the connection line 92 is well insulated thermally.

In a malfunction, the shutoff valve 93 is opened by a control device 97 (which may be mechanical, electrical, or pneumatic in design, for example), and first cryogenic fluid flows from the cavity 9 into the container 91 and is contained there. The sorption pump 90 does not require electrical operating current, so that this pump principle is also readily applicable in the event that the loss of active cooling is due to an electrical current outage. If necessary, the shutoff valve 93 can be opened manually.

The sorption pump 90 is also outfitted with a heater 95, by which the container 91 can be warmed, which again releases contained fluid, so that the container 91 can be regenerated.

The cryostat 1 has a supplemental return neck tube 96, through which the cryocontainer 20 is accessible, and it can be used to supply or remove second cryofluid (such as helium).

Figure 10:
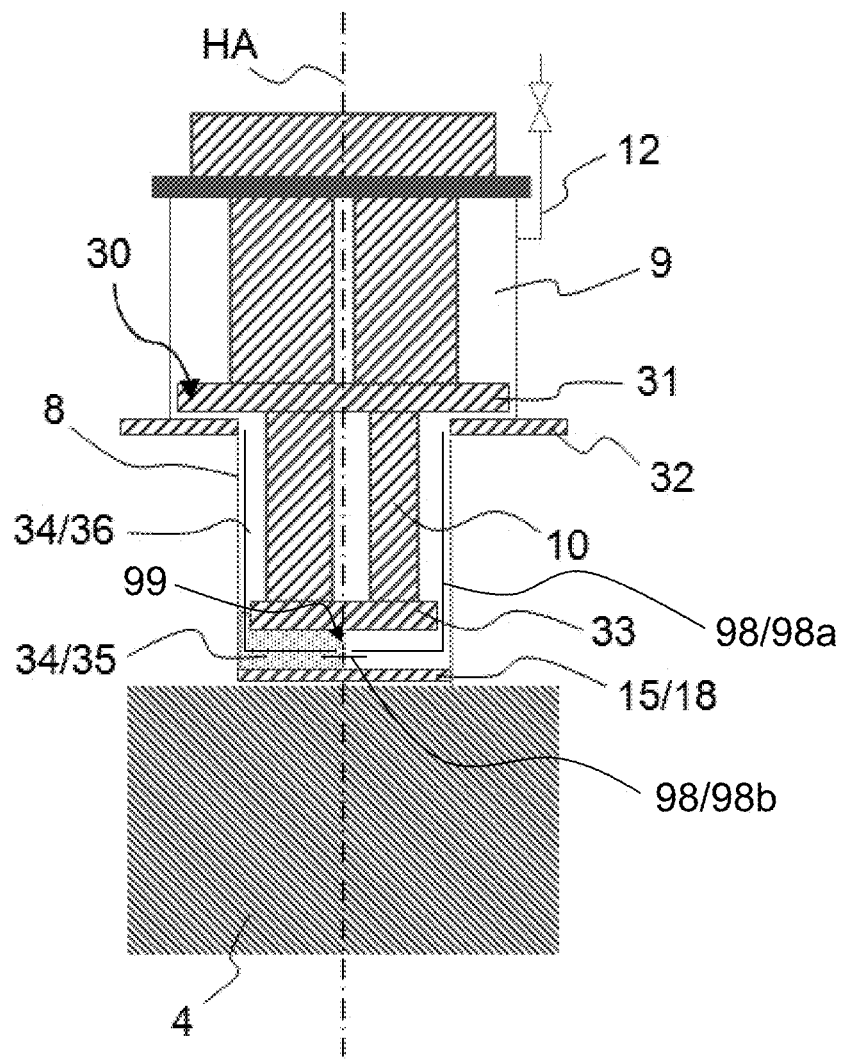
FIG. 10 is a schematic cross section through the region of the neck tube of a cryostat arrangement per FIG. 3, in addition with an open radiation shield in the cavity.

FIG. 10 shows the region of the neck tube 8 of a cryostat, similar to FIG. 3, so that only major differences will be explained in more detail.

In the fluid-tight cavity 9 there is arranged an open radiation shield 98, with which a direct input of thermal radiation to the first thermal coupling means 15 is blocked from components heating up in the event of a malfunction, here, the cooling arm 10.

For this, the radiation shield 98 surrounds a lower portion (here, approximately the lower half) of the cooling arm 10 and the lower cold stage 33. The radiation shield 98 is open at the top (towards the upper cold stage 30), but it is also passable to fluid at the bottom, so that the first cryogenic liquid 35 can flow from below into the interior of the radiation shield 98 or flow out again. A first portion 98a of the radiation shield 98 is cup shaped for this, open toward the top, with at least one opening 99 at the bottom side. A second portion 98b of the radiation shield 98 is arranged in front of this at least one opening 99, so that the at least one opening 99 is shielded, in regard to the entire width of the heat exchanger 18 or the first thermal coupling means 15.

In this way, in the event of a malfunction a direct input of thermal radiation from the cooling arm 10 through the at least one opening 99 into the heat exchanger 18 is prevented. The second portion 98b of the radiation shield 98 is axially spaced apart from the first portion 98a, so that the first cryogenic liquid 35 despite the shielding from the side can penetrate between the second portion 98b and the first portion 98a and arrive at the opening 99, and convection flows are possible in normal operation.

LIST OF REFERENCE SYMBOLS

1 Cryostat
2 Vacuum container
3 Thermal radiation shield
4 Object to be cooled/being cooled
5 Superconducting magnet coil system
6 Room temperature bore
7 Sample volume
8 Neck tube
9 Cavity
10 Cooling arm
11 Cooling head (cold head)
12 Pump line
13 Shutoff valve
14 Pump device
15 First thermal coupling component
16 Clearance
17 Monitoring device
18 Heat exchanger
20 Cryocontainer
30 Upper cold stage (cooling stage)
31 Upper contact element
32 Shield contact element
33 Lower(most) cold stage (cooling stage)
34 First cryogenic fluid
35 First cryogenic liquid
36 First cryogenic gas
40 Second cryogenic fluid
41 Second cryogenic liquid
42 Second cryogenic gas
43 Enclosure
44 Fins
50 Cooling arm container
51 Third cryogenic fluid
52 Third cryogenic liquid
53 Third cryogenic gas
54 Second thermal coupling component
56 Annular gap (at the cooling arm container)
57 Flexible membrane (at the cooling arm container)
58 Fluid entrance/overpressure relief
59 Surroundings
60 Intermediate space
61 Flexible membrane (at the intermediate space)
62 Intermediate contact element
63 Annular gap (at the intermediate space)
64 Feed line
70 Elastically length-adjustable section
90 Sorption pump
91 Container for pumping cold surfaces
92 Connection line (pump line)
93 Shutoff valve
94 Heat exchanger
95 Heater
96 Supplemental return neck tube
97 Control device (for shutoff valve)
98 Open radiation shield
98a First portion of radiation shield
98b Second portion of radiation shield
99 Opening
$B_0$ Magnetic field
HA Neck tube axis

What is claimed is:
1. A cryostat comprising:
   (a) a vacuum container; and
   (b) an object to be cooled,
      wherein the object to be cooled is arranged inside the vacuum container,
      wherein the vacuum container further comprises a neck tube, leading to the object to be cooled,
      wherein a cooling arm of a cold head is arranged at least partly in the neck tube,
      wherein a closed cavity is formed around the cooling arm, being sealed off fluid-tight from the object to be cooled, and
      wherein the cavity in normal operation is filled at least partly with a first cryogenic fluid;
   (c) a first thermal coupling component for thermal coupling of the first cryogenic fluid in the cavity to the object to be cooled,
   (d) a pump device, to which the cavity is connected, and with which the cavity is configured to be evacuated upon failure of the cooling function of the cold head; and
   (e) a monitoring device, which monitors the cooling function of the cold head, and which is configured to automatically activate the pump device upon failure of the cooling function of the cold head, so that the cavity is evacuated.

2. The cryostat according to claim 1, wherein the cooling arm of the cold head is arranged directly in the cavity.

3. The cryostat according to claim 2, further comprising:
   an outer enclosure of the cavity spaced apart from an inner wall of the neck tube, wherein an intermediate space is formed between the inner wall of the neck tube and the enclosure, open toward the object to be cooled, and
   wherein the object to be cooled toward which the intermediate space is open is a cryocontainer, filled at least partly with a second cryogenic fluid, and wherein the intermediate space comprises a feed line for the second cryogenic fluid to be introduced or returned.

4. The cryostat according to claim 3, wherein the cold head including the enclosure of the cavity is mounted to be mechanically decoupled from the rest of the cryostat including the object to be cooled, further comprising a flexible membrane, which seals off the intermediate space from the surroundings.

5. The cryostat according to claim 1, wherein the cooling arm is arranged directly in a cooling arm container, and the cavity is formed around the cooling arm container such that the cooling arm container is sealed off fluid-tight from the cavity, and further comprising: a second thermal coupling means, for the thermal coupling of the first cryogenic fluid in the cavity to the interior of the cooling arm container, wherein a third cryogenic fluid is arranged in the cooling arm container.

6. The cryostat according to claim 5, wherein the cold head is mounted to be mechanically decoupled from a wall of the cooling arm container and the rest of the cryostat including the object to be cooled, and wherein a flexible membrane spans an annular gap between the wall of the cooling arm container and the cold head and seals off the interior of the cooling arm container from the surroundings.

7. The cryostat according to claim 1, wherein the object to be cooled is a cryocontainer, and an outer enclosure of the cavity protrudes into an upper region of the cryocontainer.

8. The cryostat according to claim 7, wherein a first cryogenic liquid is arranged in the cavity in normal operation, a second cryogenic liquid is arranged in the cryocontainer, and the outer enclosure of the cavity is submerged in the second cryogenic liquid in the cryocontainer.

9. The cryostat according to claim 2, wherein a first cryogenic liquid is arranged in the cavity in normal operation, a second cryogenic liquid is arranged in a cryocontainer, and an outer enclosure of the cavity is submerged in the second cryogenic liquid in the cryocontainer, and wherein at least a lower cold stage of the cooling arm is submerged in the first cryogenic liquid in the cavity.

10. The cryostat according to claim 5, wherein a first cryogenic liquid is arranged in the cavity in normal operation, a second cryogenic liquid is arranged in a cryocontainer, and an outer enclosure of the cavity is submerged in the second cryogenic liquid in the cryocontainer, and wherein the cooling arm container is submerged in the first cryogenic liquid in the cavity, and a third cryogenic liquid is arranged in the cooling arm container, in which at least a lower cold stage of the cooling arm is submerged.

11. The cryostat according to claim 1, wherein the pump device is configured as a sorption pump, whose pumping cold surfaces are thermally coupled to the object to be cooled, and wherein a connection line extends from the cavity to the pumping cold surfaces entirely inside the vacuum container.

12. The cryostat according to claim 1, wherein the object to be cooled is a cryocontainer, which is filled at least partly with a second cryogenic fluid, and wherein a superconducting magnet coil system is arranged in the cryocontainer.

13. The cryostat according to claim 1, wherein the object to be cooled is a superconducting magnet coil system, which is arranged directly in the vacuum container.

14. A method for operating a cryostat comprising:
providing a first thermal coupling component for thermal coupling of a first cryogenic fluid in a cavity to an object to be cooled,
wherein the object to be cooled is arranged in a vacuum container comprising a neck tube, the neck tube leading to the object to be cooled,
wherein a cooling arm of a cold head is arranged at least partly in the neck tube,
wherein a closed cavity is formed around the cooling arm, sealed off fluid-tight from the object to be cooled;
operating the cryostat under normal operation with an at least partial filling of the cavity with the first cryogenic fluid to cool the object inside the vacuum container; and
evacuating the cavity upon failure of the cooling function of the cold head.

15. A method according to claim 14, wherein the object to be cooled is a superconducting magnet coil system or a cryocontainer.

* * * * *